United States Patent [19]

Kent et al.

[11] Patent Number: 4,527,731
[45] Date of Patent: Jul. 9, 1985

[54] METHOD AND APPARATUS FOR APPLYING STRIPES OF SOLDER TO ARTICLES

[75] Inventors: William C. Kent; Charles H. Payne, both of Garland, Tex.

[73] Assignee: AT&T Technologies, Inc., New York, N.Y.

[21] Appl. No.: 481,088

[22] Filed: Mar. 31, 1983

[51] Int. Cl.³ .............................................. B23K 31/02
[52] U.S. Cl. .................... 228/180.2; 228/37; 228/39; 228/43; 228/215
[58] Field of Search .................. 228/36, 37, 39, 40, 228/43, 180 A, 180 R, 185, 260

[56] References Cited

U.S. PATENT DOCUMENTS

| | | | |
|---|---|---|---|
| 3,039,185 | 6/1962 | Oates | 228/259 |
| 3,151,592 | 10/1964 | Wegener | 22/205 |
| 3,277,566 | 10/1966 | Christensen | 228/37 |
| 3,363,819 | 1/1968 | Gerlitz | 228/36 |
| 3,604,611 | 9/1971 | Lamberty | 228/36 |
| 3,616,984 | 11/1971 | Voroba | 228/33 |
| 3,726,465 | 4/1973 | Boynton et al. | 228/37 |
| 3,765,591 | 10/1973 | Cook | 228/37 |
| 3,767,102 | 10/1973 | Parsons | 228/37 |
| 4,447,001 | 5/1984 | Allen et al. | 228/37 |

FOREIGN PATENT DOCUMENTS 172840 12/1921 United Kingdom .

Primary Examiner—Nicholas P. Godici
Assistant Examiner—Maureen Weikert
Attorney, Agent, or Firm—R. P. Miller; M. de Picciotto

[57] ABSTRACT

Pressurized molten solder 71 is flowed along a confined first channel 86 and forced through a series of spaced, aligned apertures 88 as solder jets which rise, fall and merge to form a solder stream which flows along a second channel defined by channel walls 93 and 94. Spring held printed circuit boards 10 are advanced by a conveyor 21 which is tilted to move a far section of each board into engagement with the top of channel wall 93 and then a near section of each board into engagement with the top of channel wall 94 whereafter the board is spring held to ride along the tops of channel walls while a thin stripe of solder is applied to the board.

19 Claims, 9 Drawing Figures

FIG. 9
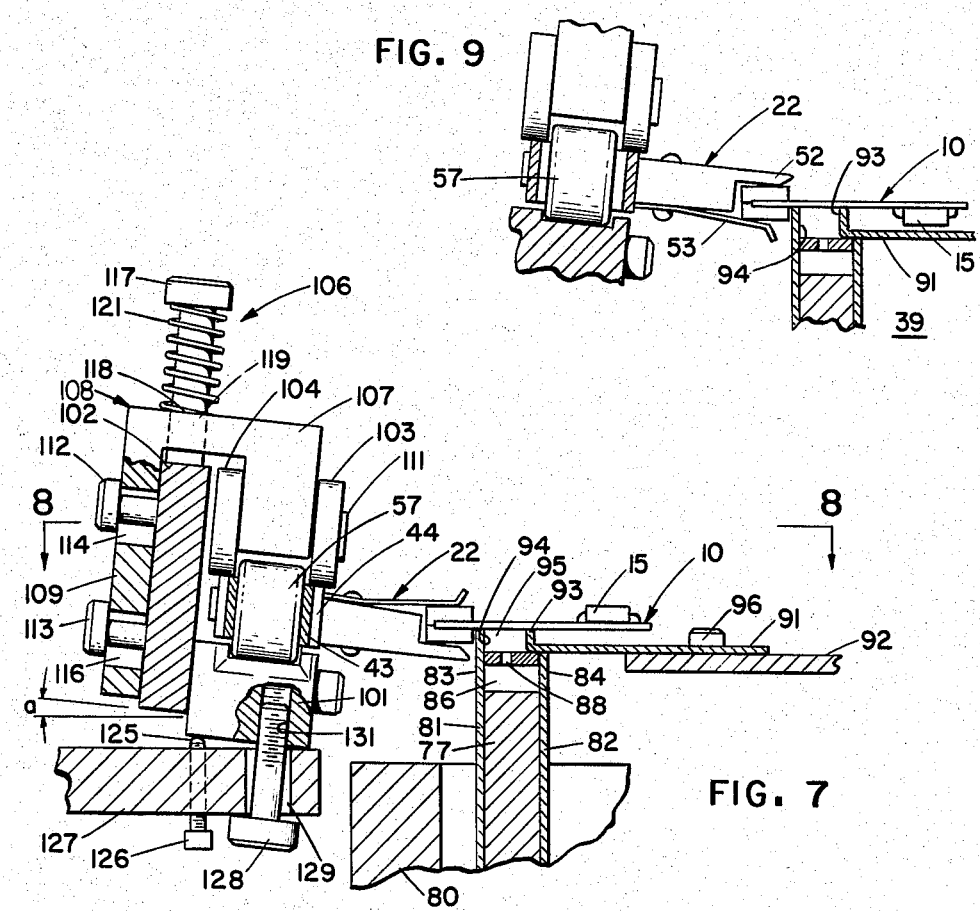
FIG. 7
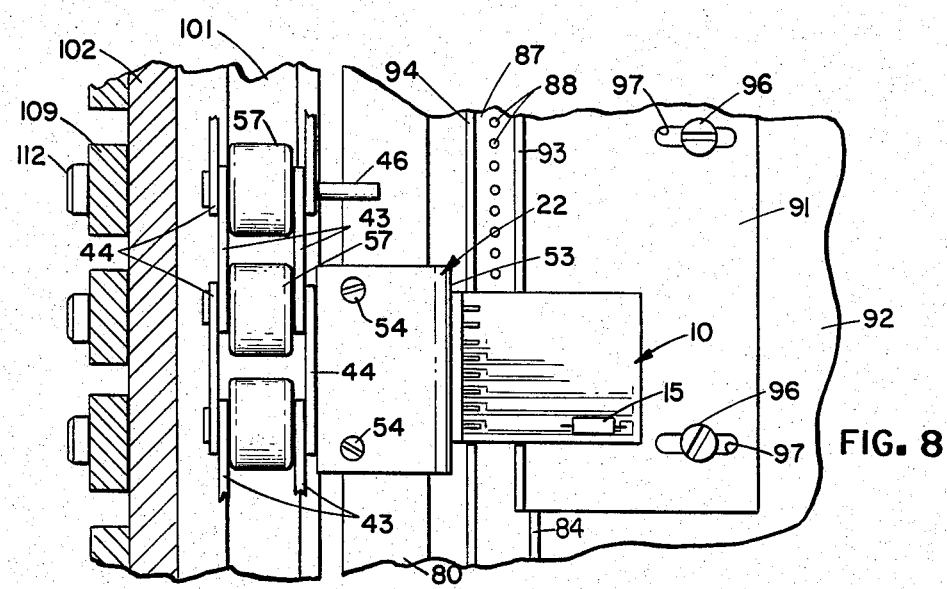
FIG. 8

METHOD AND APPARATUS FOR APPLYING STRIPES OF SOLDER TO ARTICLES

FIELD OF INVENTION

This invention relates to methods and apparatus for applying a stripe of solder to an article and, more particularly, to forming an inclined contiguous series of solder jets and then moving a succession of parts along the incline and through the jets to deposit stripes of solder to each of the parts.

BACKGROUND OF THE INVENTION

Printed circuit boards of diverse size are extensively used in the manufacture of innumerable electrical devices. These boards have circuit paths formed on one or both sides and electrical components are mounted on and connected to the circuit paths. The circuit components are usually secured to the circuit paths by a soldering operation such as wave soldering. These printed circuit boards also find use as elements of connectors, such as back plane connectors, extensively used in construction of telephone equipment. One type of back plane connector consists of a small printed circuit board having parallel conductor paths running across both sides of the board to edge contact pads which are overlayed with terminals projecting from sockets mounted on the opposite edges of the boards. The terminals are bonded to the contact pads with solder that may be applied by moving the boards through a narrow solder wave. In the application of solder waves to these connector boards, great care must be exercised to be sure that the solder is only applied to the finite areas of the overlayed terminals and contact pads. In the manufacture of many other printed circuit boards there is often a requirement that the solder be only applied at specific definitive solder sites.

Mass production of printed circuit boards requires automated facilities for applying solder to a number of sites on the board to establish solder connections between the printed circuit paths and the components or other elements mechanically mounted on the board. One common mass soldering expedient contemplates the generation of a wave of molten solder and then conveying the circuit boards in such manner as to engage the undersides of the boards with the wave of solder to deposit solder at the desired sites. In many instances the application of solder must be restricted to specific sites because application of solder to other areas on the board may result in the damage of heat sensitive components mounted on the board or the flow of solder into plated through holes that are to be subsequently utilized to mount additional components. In the manufacture of the previously mentioned printed circuit board connectors, there is a requirement that the solder application be confined to those areas containing the terminals and the overlying contact pads formed on the board.

Selective application of solder to designated solder sites of the circuit board may be accomplished by applying solder resist coatings to those areas which are not to receive solder. This expedient results in added manufacturing cost, in that time must be taken to apply the resist, remove the resist, and clean the circuit board. Another expedient contemplates securing a mask to the board leaving those areas to receive the solder exposed during subsequent movement of the board through a solder wave. Again, added manufacturing steps are required, increasing the cost of the soldering application. The masks are often expensive to construct and unless firmly secured to the board there is a tendency for the solder to creep under the mask into areas that should be devoid of solder.

In instances where the selected sites on the circuit board are arranged in a row, an adjustable weir may be used to set the width of the solder wave so that the solder is only applied to the selected row of solder sites as the board is conveyed through the solder wave. An example of such an apparatus is shown in U.S. Pat. No. 3,604,611, issued Sept. 14, 1971, to J. Lamberty, wherein a solder wave is generated and confined between a pair of vertically extending extending side plates one of which is adjustable to control the width of the wave, and hence the width of the solder applied to a circuit board that is moved through the solder wave by a conveyor.

Another problem that exists when solder is to be applied to selected sites on a printed circuit board, resides in the need to maintain solder sites in the solder wave for times sufficient to deposit coatings of solder of adequate thickness so as to establish good solder bonds. In order to meet this problem, solder wave equipments have been developed wherein a solder wave is flowed as a stream along an inclined channel in a direction opposite to the direction of movement of the conveyed printed circuit board through the stream. One such system is shown in U.S. Pat. No. 3,039,185, issued June 19, 1962, to W. L. Oates, wherein a solder wave is generated and flowed through an inclined channel having a number of transverse ribs which function to form the wave into a series of undulating crests through which the printed circuit board is conveyed at an angle corresponding to the angle of the incline.

It will be noted that many of the prior art devices depend on a conveyor for advancing the circuit boards through a solder wave. Due to the aggregrate of tolerances required in the construction of parts for the conveyor there are inherent mechanical limitations in providing a conveyor that is capable of precisely positioning a board as the board is passed through the solder wave. Further, in wave solder systems utilizing adjustable channel plates to control the width of the solder wave, an additional problem exists in that the conveyor speeds must be limited otherwise there is spillage over the sides of the channel plates onto sections of the printed circuit board that are required to be free of solder. In these mass soldering operations, concern must also be given to the control of the heat of the applied solder which may be detrimental to heat sensitive components mounted on other areas of the circuit board.

SUMMARY OF INVENTION

This invention contemplates, among other things, methods and apparatus for applying and depositing sufficient solder to precise locations on a printed circuit board advanced by a rapidly moving conveyor through a solder stream without resultant damage to heat sensitive electrical components mounted on other sections of the board.

More particularly, a solder stream of precise controllable width is generated by impressing pressurized solder into an inclined chamber comprising a channel having a pair of side walls of equal height. A bar is mounted within the side walls to establish a solder stream bed, and the bar is provided with a series of aligned longitudinally spaced holes through which the pressurized solder is forced to form a series of contiguous jets. The jets merge to form a solder stream that flows down the inclined channel. The side walls are constructed of a non-solder wettable material so that there is a meniscus effect between the edges of the solder stream and the top inner surfaces of the side walls which in conjunction with the jets of solder form a swell of solder along the center of the solder stream that projects above the top surfaces of the side walls.

Printed circuit boards are mounted in spring loaded clips projecting from a conveyor chain, whereafter the boards are advanced toward the solder stream in such a fashion that the underside of the board is moved into engagement with the surface of the solder stream. As each clip is advanced toward the solder stream, an associated section of the conveyor is tilted to move a far section of the board into engagement with the top surface of a far side wall of the inclined channel. The engagement of the board with the far wall results in a pivoting of the board against the spring clip to move a near section of the board into engagement with the near side wall of the inclined channel, whereafter the board slides along the top surfaces of the side walls. With this arrangement, the board moves parallel to the solder stream bed and is prevented from wobbling while the solder stream is impinged and deposited along a stripe on the underside of board. The board exits from the solder stream with a thin stripe of solder applied to the prescribed sites on the board.

Continued advancement of the conveyor moves the circuit boards about a sprocket arrangement and turns each printed circuit board upside down to present the reverse side of the board to a second fluxing station. The reverse side of the board receives a coating of flux and then the board is advanced to a second solder application station where a second stripe of solder is applied at a precise location on the reverse side of the board. Next, the boards with the solder stripes on both sides are advanced along with the conveyor chain through a cleaning station to remove most of the excess flux and any foreign material picked up by the chain and the board. Finally, the soldered, clean boards are moved back to the initial load station where the boards are removed.

BRIEF DESCRIPTION OF DRAWINGS

Other advantages and features of the invention will be apparent upon consideration of the following detailed description when considered in conjunction with the drawing wherein:

FIG. 7 is a sectional view taken along line 7—7 of FIG. 5 showing a camming arrangement for tilting the conveyor chain and a spring clip to press the printed circuit board against the side walls of a channel into which the solder jets are projected to form a stream that impinges against the underside of the circuit board;

FIG. 8 is a top view taken along line 8—8 of FIG. 7 showing the construction of an adjustable member for setting the width of the solder stream produced by the solder jets; and FIG. 9 is a side view of a spring clip in a second solder station for applying a solder strip to a second side of the printed circuit board.

DETAILED DESCRIPTION

Figure 2:
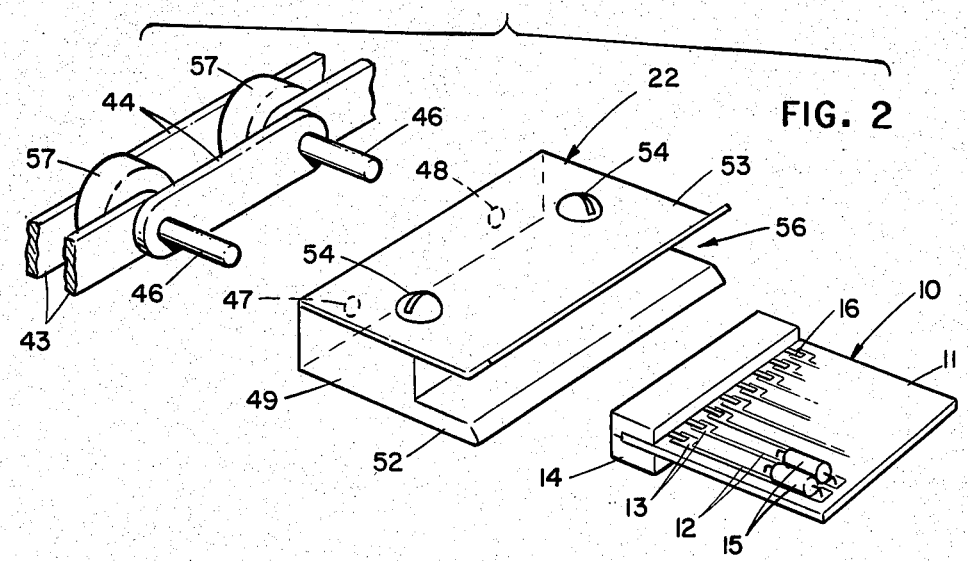
FIG. 2 is a perspective view of a section of a conveyor chain for supporting a spring clip into which is inserted a printed circuit board.
Figure 3:
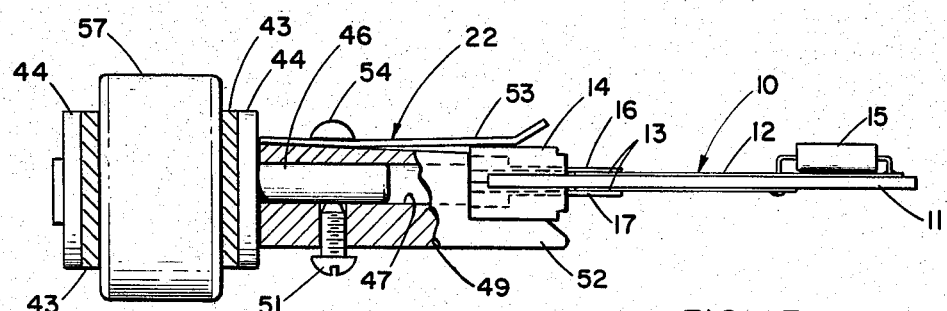
FIG. 3 is a side view partially cut away to illustrate the construction of the spring clip shown in FIG. 2.

As best shown in FIGS. 2 and 3 there is disclosed a printed circuit board generally designated by the reference numeral 10 on which it is desired to apply solder to certain selected sites. Board 10 consists of a base phenolic support 11 having conductor paths 12 formed on both sides which extend into contact pads 13. Secured to a forward edge of the board is a socket housing 14 having two tiers of holes into which are seated two tiers of terminals 16 and 17. Mounted on the board are a number of circuit components 15. Trailing extremities of the terminals project from the socket housing 14 to overlie the contact pads formed on opposite sides of the board. A significant object of the disclosed apparatus and method resides in the application of solder stripes to both sides of the board to solder bond the terminals to the underlying contact pads. This is a specific application of the invention, but it will be readily realized that the invention has utility in applying solder stripes to devices or articles other than printed circuit boards.

Figure 1:
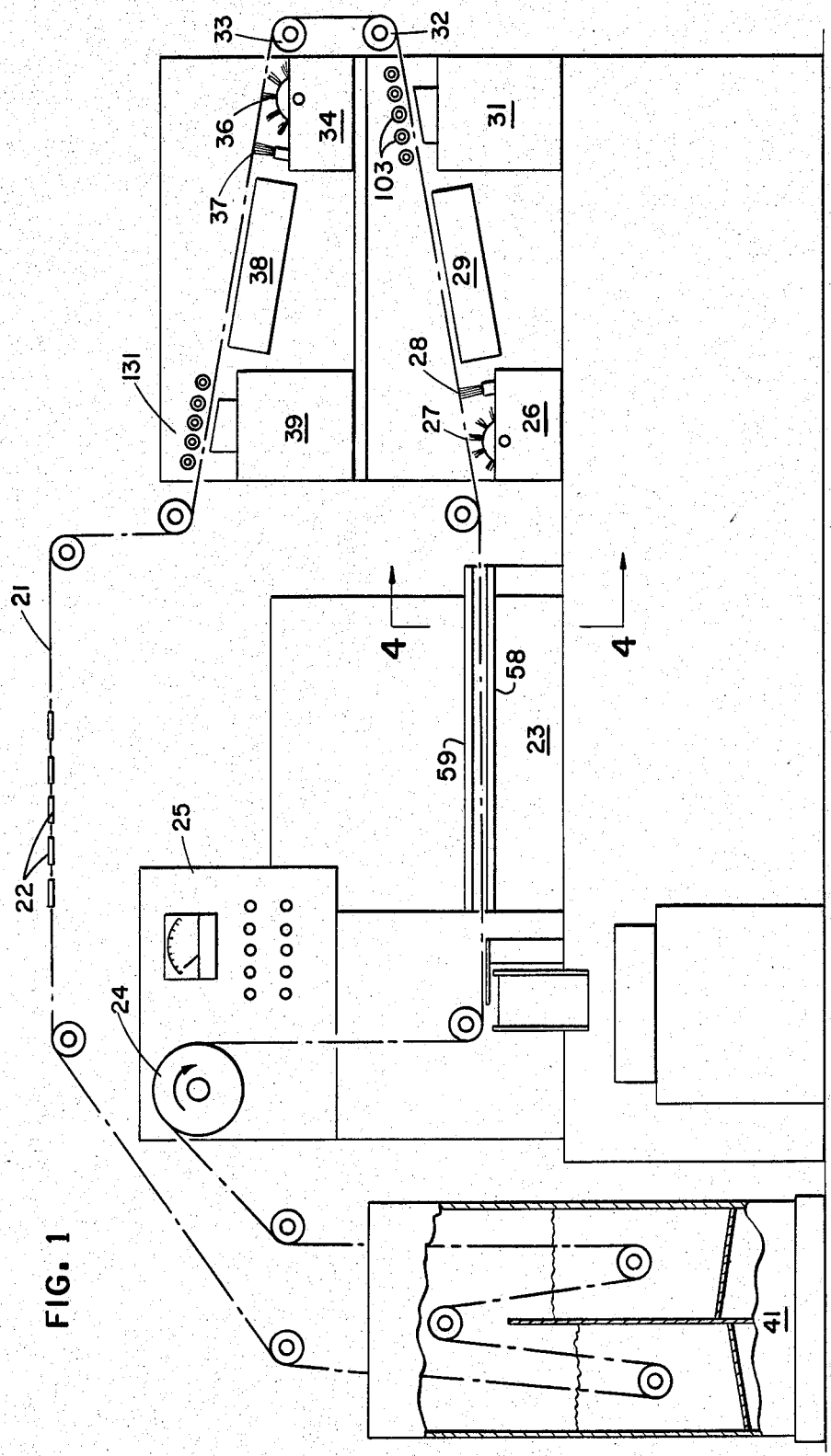
FIG. 1 is a side elevational view of a conveyorized wave soldering apparatus for applying stripes of solder on both sides of a printed circuit board in accordance with the principles of the invention.

Referring to FIG. 1 for a brief consideration of the overall operation of the apparatus, there is shown a conveyor chain 21 having evenly spaced work holder clips 22 into which the circuit boards 10 are loaded by an attending operator at a load/unload station 23. The chain is endless and is moved by a motor driven sprocket, such as sprocket 24. The conveyor movement and the operation and regulation of the various component devices forming the system are initiated and managed by suitable controls on a panel 25. As the chain advances, each printed circuit board is moved through a fluxing station 26 where a rotary brush 27 applies a stripe of flux to the underside of the board so that the contact pads 13 and terminals 17 are fluxed. Excess flux is removed by stationary brush 28. The fluxed circuit boards are successively advanced over a preheater 29 that functions to heat the boards to a sufficient temperature to abet the subsequent deposition of sufficient solder to effectuate a good solder bond between the terminals and the contact pads on the underside of the circuit board.

The fluxed and preheated boards are now advanced into a solder application station 31 and are moved through a narrow solder stream where the solder is only applied to the terminals 17 and the underlying contact pads 13. Next, the chain advances the boards about a pair of reversing sprockets 32 and 33 that cause the boards to be turned upside down. The non-soldered side of the board is then passed through a second fluxing station 34 where a rotary fluxing brush 36 applies a stripe of flux to the unsoldered terminals and underlying contact pads. Excess flux is again removed by a stationary brush 37, whereafter the boards are advanced in a path adjacent to a second preheater 38. The fluxed and preheated boards are advanced through a second solder station 39 similar in construction to solder station 31. There the exposed ends of the terminals 16 and the underlying contact pads 13 receive a coating of solder from a second solder stream. The conveyor moves the boards through a commercial cleaning station 41 constructed of two tanks of cleaning fluid. The cleaning fluid acts to clean most of the flux from the board and also removes other foreign matter, such as grease and dirt, from the conveyor chain and the work holders.

Figure 4:
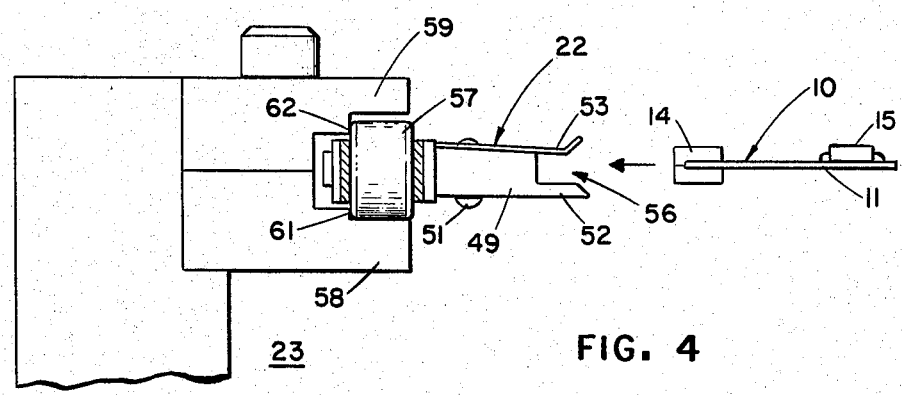
FIG. 4 is a sectional view taken along lines 4—4 of FIG. 1 showing the spring clip in a loading station.

Considering the details of construction of the conveyor chain 21 and the work holder or spring clip 22, there is shown in FIGS. 2, 3 and 4 a conveyor chain made up of alternating nested pairs of links 43 and 44 coupled together with pins 46. Each pair of pins 46 have projecting sections extending into bores 47 and 48 formed in a support 49. The support 49 is secured to the pins 46 by screws 51. Each support is formed with an extending ledge 52 over which is a sheet 53 of spring metal secured by screws 54 to the support 49. The space between the ledge 52 and the spring metal sheet 53 define a nest 56 for receiving the socket housing 14 of the circuit board 10. When a socket housing 14 is inserted in the nest, the spring 53 is deflected in a manner shown in FIG. 3 to seat and hold the housing within the nest.

Returning now to a further consideration of the construction of the chain 21, it will be noted from FIGS. 2, 3 and 4 that the link pins 46 also serve as bearing mountings for rollers 57 having diameters exceeding the heights of the links 43 and 44. When the conveyor chain advances a spring clip 22 into the load station 23, the rollers ride between a pair of stablizing rails 58 and 59 to steady the chain while the attending operator removes or inserts a circuit board from or into the nest 56. The loading of a board 10 into a clip 22 is depicted in FIG. 4. The spring 53 has a flared end to facilitate the movement of the board housing 14 into the nest. When a board 10 is pushed into the nest 56, the large rollers 57 are pressed against rail sections 61 and 62 to immobilize the clip while the housing 14 is being fully seated within the nest.

Figure 5:
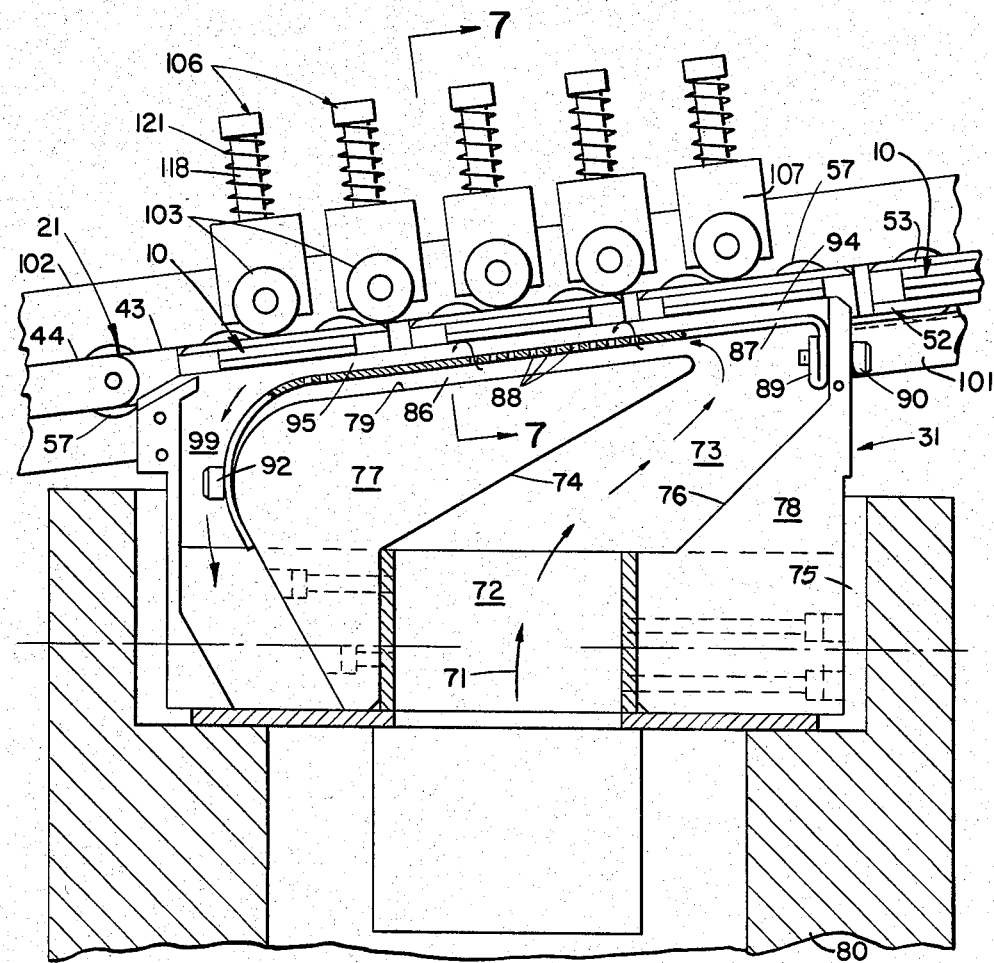
FIG. 5 is a side view substantially in section showing printed circuit boards being advanced through a solder stripe application station.
Figure 6:
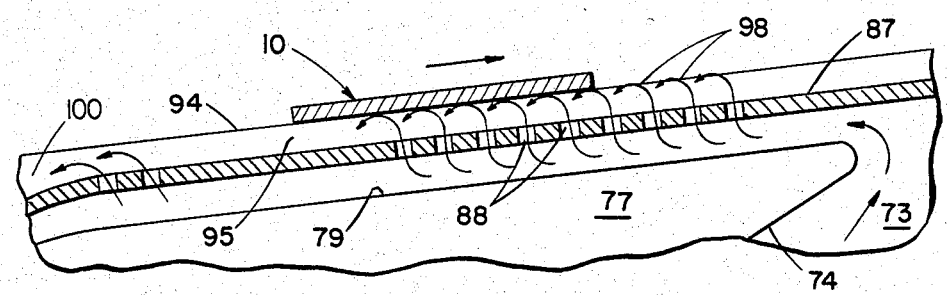
FIG. 6 is an enlarged view of the facilities for applying a solder wave through a series of holes in a bar to form a series of contiguous solder jets.

Attention is now directed to FIGS. 5, 6 and 7 for a description of the facilities at the solder stations 31 and 39, both identical in construction, and which in the aggregate function to apply thin solder stripes to both sides of the circuit board. Pressurized molten solder (depicted by the arrows) 71 is delivered from a pump (not shown) of commercial manufacture to a well 72 from which the molten solder moves through a throat 73 defined by a pair of angular walls 74 and 76 of metallic members 77 and 78. Members 77 and 78 are mounted within an opening 75 formed in a pedestal base 80. Member 77 is formed with an inclined upper surface 79 forming a first bed for the wave of solder emanating from the throat 73. Secured to opposite sides of member 77 (see FIG. 7) are a pair of thin metallic plates 81 and 82 which have sections 83 and 84 projecting above the bed surface 79 to provide a channel 86 for the solder wave. The plates are constructed of a metal, e.g., titanium that is not wetted by the solder. A bar 87 having a series of aligned longitudinally spaced apertures 88 is mounted in the channel 86 to confine the solder. A non-apertured section of the bar is bent back upon itself to form a mounting 89 which is secured by a bolt 90 to the member 78. The other end of the bar is arcuately formed and secured by a bolt 92 to the member 77.

As seen in FIG. 7, an L-shaped plate 91 is mounted on a frame section 92 of the housing for the soldering apparatus. A channel wall leg 93 of member 91 rests on the top of bar 87 and cooperates with a further extension 94 of the plate 81 to form a second channel 95. The member 91 may be adjustably positioned by loosening bolts 96 extending through slots 97 formed in the member 91. The width of the channel 95, and hence the width of a solder stream flowing therein, may be adjusted by loosening the bolt 96 and shifting the L-shaped member 91 to move the channel wall leg 93 in or out along the top surface of the bar 87. As the solder is emitted from throat 73 into confined channel 86, portions thereof are exited through the apertures 88 as a series of solder jets 98 (see FIG. 6). The spacings of apertures 88 are selected so that the jets issuing from the apertures peek, drop and spread to merge with each other to form a continuous stream of solder 100 which runs down the inclined bar 87 within the channel 95. The solder stream moves into an exit throat 99 and from there the solder is returned to a pump for subsequent recirculation by the pump to the well 72.

As each holding clip 22 approaches the solder station, the associated conveyor rollers 57 ride into an upwardly extending trackway 101. The angle of incline of the track way is set to be substantially the same as the angle of incline of the bar 87 forming the bed of the solder channel 95. The trackway 101 is secured to a mounting plate 102. As viewed in FIG. 7, it will be noted that the trackway 101 is also mounted at an incline to the horizontal and is effective to tilt the chain and the associated work holder clips 22. More particularly, as each segment of the chain approaches the soldering station, the links 43 and 44 are engaged by a pair of rollers 103 and 104 of a first of a series of hold-downs 106. Each pair of rollers 103 and 104 subtend a depending arm support 107 of a generally U-shaped member 108 having a second arm 109 abutted against a side wall of the elongated mounting plate 102. The rollers 103 and 104 are secured to an axle 111 that is journaled in a hole extending through arm 107. Arm 109 is slideably held against plate 102 by a pair of guide bolts 112 and 113 which extend through elongated slots 114 and 116 into tapped holes formed in plate 102. Each hold down 106 also includes a bolt 117 having a shank 118 extending through a bore 119 formed in U-shaped member 108. The bolt 117 is threaded into a tapped bore formed in the plate 102. Positioned about the shank 118 is a spring 121 which bears against the bolt head to press the U-shaped member 108 downwardly to force the rollers 103 and 104 against the links 43 and 44.

The trackway 101 is tilted from the horizontal at an angle "a" so that the advancing work holder clip 22 is tilted to move a remote first section of the board 10 into engagement with the top surface of the leg 93 whereafter a second section of the board is abutted against the top surface of the plate extension 94. This tilting action may be controlled by an adjustment bolt 126 which extends through a threaded bore in a fixed support member 127 forming part of the housing at the soldering station. The adjustment is accomplished by turning the bolt 126 so that a projecting end 125 of the bolt moves against the bottom surface of the trackway 101. The tilt of the trackway 101 is locked by a bolt 128 extending through a hole 129 formed in member 127 to threadably engage within tapped hole 131 formed in the trackway 101. Subsequent movement of the board 10 along the tops of the side walls 94 and 93 of the channel 95 is in a translatory fashion along an inclined plane defined by the tops of the channel side walls 94 and 93.

In use of the apparatus and practice of the method, the attending operator will check the chain and work holder clip tilting arrangement to ensure that the circuit boards 10 ride flush along the top guide surface of the channel side members 94 and 93. Specifically, the lock bolt 128 is loosened and the bolt 126 is adjusted until a sample board is tilted an appropriate amount to move the board into engagement with the top guide surface of the channel side member 93 and then into engagement with the top guide surface of the channel side member 94. Lock bolt 128 is thereafter returned to set the adjustment.

Next, the attending operator will adjust the position of the plate 91 and the channel defining leg 93 to set the width of the solder stream in channel 94. This is easily accomplished by loosening the bolts 96 and then sliding the member 91 in or out to move integral channel wall leg 93 on the surface of bar 87 to set the width of the solder stream channel 95.

Controls on a panel 25 are operated to energize a heating means at the solder stations 31 and 39 to melt the solder, whereafter the solder at each station is pumped through the well 72 and throat 73 into the confined chamber 86. The pressurized solder within the chamber 86 is forced through the aligned series of apertures 88 to form the series of jets 98 which rise, drop and merge to flow as a solder stream 100 downwardly along the inclined channel 95. The solder stream is observed, and through the controls on the panel, the solder pump is regulated so that the solder in the channel 95 does not overflow the tops of the channel defining members 94 and 93. There is a meniscus effect between the solder and the tops of the channel side members 94 and 93 constructed of non-solder wetting material (titanium) so that most of the span of the solder stream is slightly above the tops of the side members. In addition, due to the fact that the stream is made up of a series of solder jets issuing from the bed holes 88 along the center of the stream, there is a swell at the center of the stream which is slightly higher than the stream edges.

Additional controls on the panel 25 are operated to initiate movement of the chain 21 which moves each work holder clip through the load station 23 where the chain rollers 57 ride between stabilizing the guide rails 58 and 59. As shown in FIG. 4, a board is pressed into nest 56 to slightly deflect the spring 53 as shown in FIG. 3. The boards 10 are advanced through the fluxing station 26 and the preheater 29, and thereafter the chain rollers 57 ride on to the tilting trackway 101. Each spring clip held board 10 is moved to initially engage the top guide surface on channel side member 93 and is further tilted into engagement with the top guide surface on channel side member 94. In so doing, the spring metal sheet 53 is further flexed. The board 10 is then advanced in a translatory fashion parallel to channel bed 87 against the flow of the solder stream to receive a stripe of solder which adheres to the underside terminals 17 and the underlying contact pads 13. The solder does not adhere to the intervening exposed sections of the board which are constructed of plastic, a non-solder wettable material. The stream is relatively long thus ensuring a deposit of sufficient solder to establish good bonds between the terminals and the contact pads. Further, the extended length of the solder stream permits the chain to advance rapidly to move a large number of clip held boards through the solder stream, and yet each board is held in the solder stream long enough to receive the necessary deposit of solder. The high temperature molten solder is confined to the channels 86 and 95 and thus is isolated from the components 15 on the board 10. This isolation of the solder and the selective application to restricted areas on the board insures that any heat sensitive components 15 mounted on other areas of the boards are not damaged.

Following the application of solder at station 31, the chain moves about sprockets 32 and 33 to turn the board over whereafter the now non-soldered underside of the board (see FIG. 9) is passed through the fluxing station 34 and preheater station 38 in solder station 39. Tilting and hold down facilities 131, similar to the board tilting facilities 101-106 at solder station 31, are effective to again tilt the board to run the underside of the board along a relatively long thin solder stream. The solder deposits bond the terminals 16 to contact pads 13. The manner in which the board 10 is held in the resilient clip 22 as the board is passed through solder station 34 is shown in FIG. 9. The soldered board is thereafter advanced into the cleaning tank 41 and returned to the load station 23 where the operator removes the soldered board and inserts another board into the work holder clip 22.

What is claimed is:

1. An apparatus for applying solder stripes to articles advanced by a conveyor, which comprises:
   a plurality of work holders having resilient clips for holding the articles projecting laterally from the conveyor;
   a pair of plates having laterally aligned first and second top surfaces;
   means for tilting the conveyor to move each held article into engagement with the first top surface and then the second top surface against the bias of the resilient clips to hold the articles to ride along both said top surfaces; and
   means for flowing a solder stream between said pair of plates to impinge on the articles moving along the top surfaces.

2. An apparatus as defined in claim 1, which comprises:
   a first bed positioned between said pair of plates for flowing the solder as a stream.

3. An apparatus as defined in claim 2 which comprises:
   a bar mounted between said pair of plates above said first bed to form a second solder stream bed; said bar having a plurality of aligned, longitudinally spaced holes through which the solder flows to form a series of contiguous jets of solder which drop and merge forming a solder stream that runs along said second bed while impinging on the articles riding along the top surfaces of said pair of plates.

4. An apparatus as defined in claim 1, wherein the top surfaces of said plates extend at upward inclines with respect to the horizontal; and which comprises:
   means for moving the conveyor to move the work holders along an upward incline corresponding to the inclines of the top surfaces of said plates.

5. An apparatus as defined in claim 3, which includes:
   means to secure one end of said bar to the first bed to form a confined chamber into which the solder flows and is forced to exit through the holes formed in the bar as series of jets.

6. An apparatus as defined in claim 5 which comprises:
a well through which the solder is flowed, and
said bar extends over the well to direct the solder into said chamber.

7. An apparatus as defined in claim 1, wherein the conveyor includes:
a series of links interconnected by a series of pins,
rollers mounted on said pins having diameters exceeding the width of said links, and wherein said tilting means includes a trackway for receiving the rollers, said trackway being tilted downwardly toward the top surfaces of said pair of plates.

8. An apparatus as defined in claim 7 which includes:
means for adjusting the tilt of the trackway to insure that the articles ride along the top surfaces of said pair of plates.

9. An apparatus as defined in claim 7 which includes:
means for engaging said conveyor links to hold said conveyor rollers to ride along said trackway.

10. An apparatus as defined in claim 9 wherein said conveyor link engaging and holding means, comprises:
pairs of rollers spanning said conveyor rollers to engage said conveyor links, and
means for resiliently urging said pairs of rollers to engage said conveyor links.

11. An apparatus for applying a solder stripe to an article, which comprises:
a pair of channel side plates having laterally aligned inclined top surfaces;
an inclined bar secured between said side plates at a uniform distance from said top surfaces, said bar and said side plates defining a first inclined channel, said bar having a single row of aligned longitudinally spaced holes;
means for forcing molten solder through said holes as a series of contiguous jets of solder which rise, drop and merge to form a solder stream which flows down said inclined channel with a center swell that is slightly higher than the top surfaces of said side plates; and
means for moving the article along said top surfaces of said channel side plates to receive a stripe of solder.

12. An apparatus as defined in claim 11, which comprises:
a bed member secured between said side plates beneath said bar forming a second channel for receiving the molten solder; and
means for blocking one end of the second channel to confine and force said solder through said holes in said bar into the first channel.

13. An apparatus as defined in claim 11 wherein said channel side plates are formed of a non-solder wettable material so that there is a meniscus effect between the edges of the solder stream and the tops of said side plates, said jets of solder and meniscus effect causing the swell of solder along the center of said solder stream which extends above the tops of said side plates.

14. A method of applying a stripe of solder to an article, which comprises:
producing a series of longitudinally aligned jets of solder which are spaced close enough to each other to peak, fall back and merge with each other to form a longitudinally flowing elongated narrow solder stream having in a transversal direction a swell of solder projecting from, and extending longitudinally along, the center of the stream; and
advancing the article in the longitudinal direction relative to the flow of the stream to impinge the longitudinal swell of the solder along the center of the stream against the article.

15. A method as defined in claim 14 which comprises:
confining said solder stream to flow in an inclined channel having side walls constructed of non-solder wettable material to provide a meniscus effect between the edges of the solder stream and the side walls thereby causing, in conjunction with said series of jets of solder, said longitudinal swell of the solder stream to project above the top surfaces of the side walls.

16. A method as defined in claim 15 which comprises:
tilting the advancing article to engage a first top surface and then a second top surface of said side walls whereafter the article is moved along said top surfaces to receive a stripe of solder.

17. A method as defined in claim 15 wherein said jets of solder are formed by flowing pressurized molten solder in a confined channel having a top member with a series of holes spaced close enough together to form solder jets which peak, spread and merge to form the solder stream.

18. A method as defined in claim 14 comprising
flowing the solder stream as the stream is formed by the jets down an incline; and
advancing the article along an upward incline corresponding to the incline of the stream to impinge the solder stream against the advancing article to deposit a stripe of solder.

19. A method of applying a stripe of solder to an article, comprising the steps of:
producing a series of aligned jets of solder which are spaced close enough to each other to peak, fall back and merge with each other to form a solder stream with a swell of solder along the center of the stream;
confining said solder stream to flow in a channel having side walls constructed of non-solder wettable material to provide a meniscus effect between the edges of the solder stream and the side walls;
advancing the article to impinge the swell of the solder stream; and
tilting the advancing article to engage a first top surface and then a second top surface of said side walls whereafter the article is moved along said top surfaces to receive a stripe of solder.

* * * * *